United States Patent [19]
Jacobson

[11] Patent Number: 5,345,198
[45] Date of Patent: Sep. 6, 1994

[54] POWER SUPPLY MODULATOR CIRCUIT FOR TRANSMITTER

[75] Inventor: Herbert P. Jacobson, Elkhart, Ind.

[73] Assignee: Crown International, Inc., Elkhart, Ind.

[21] Appl. No.: 75,230

[22] Filed: Jun. 10, 1993

[51] Int. Cl.$^5$ .................. H03C 1/36; H03F 3/217
[52] U.S. Cl. .................. 332/152; 332/178; 330/251; 330/297; 455/108; 455/126; 455/127
[58] Field of Search .......... 332/141, 152, 178; 330/10, 207 A, 251, 297; 455/108, 126, 127

[56] References Cited

U.S. PATENT DOCUMENTS

| | | | |
|---|---|---|---|
| 4,403,197 | 9/1983 | Swanson | 330/10 |
| 4,560,944 | 12/1985 | Furrer | 330/10 |
| 4,730,167 | 3/1988 | Beeken et al. | 330/10 |
| 4,745,368 | 5/1988 | Lodahl | 330/10 |
| 5,099,203 | 3/1992 | Weaver et al. | 330/10 |

FOREIGN PATENT DOCUMENTS 1186025  4/1985  Canada .

*Primary Examiner*—Siegfried H. Grimm
*Attorney, Agent, or Firm*—Baker & Daniels

[57] ABSTRACT

The present invention relates to a power supply modulator for a radio transmitter having apportioned input impedance and buffered switching of power modules. A series arrangement of power supply modules, conventionally disposed in a diode cascade, includes individual inductors to apportion the input impedance of the switching power supplies. The switching sequence of the power supplies is controlled by a FIFO buffer, with the sequentially adjacent power supplies being disposed physically remote so that current transients and thermal loads are more uniformly distributed.

20 Claims, 3 Drawing Sheets

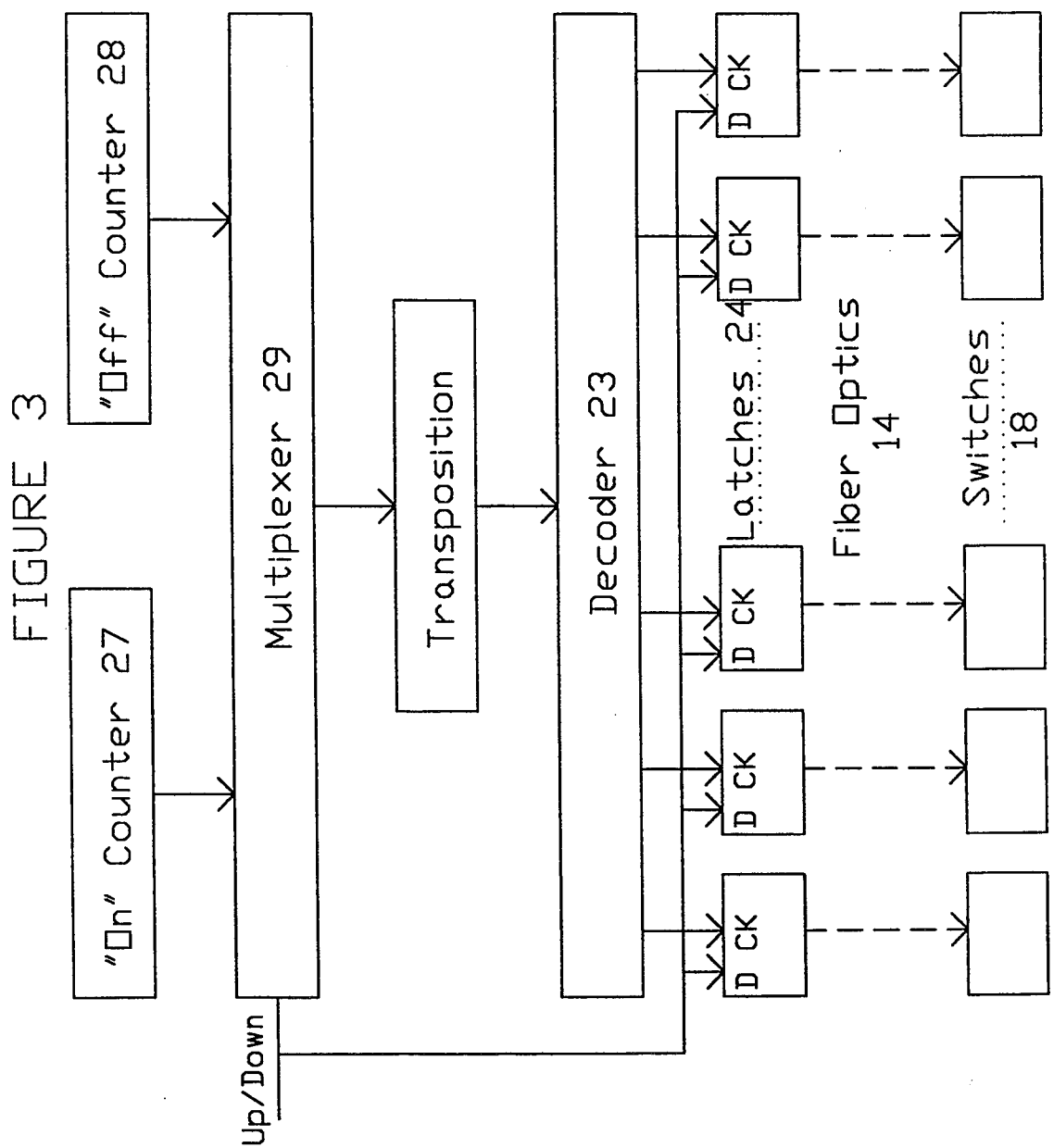

POWER SUPPLY MODULATOR CIRCUIT FOR TRANSMITTER

BACKGROUND OF THE INVENTION

1. Field of the Invention

This invention is related to power supply-modulator circuits for amplitude modulated radio transmitters.

2. Description of the Related Art

Prior amplifier circuits, for example, U.S. Pat. No. 4,403,197, issued to Swanson, employs digital switching of incremental signal sources for amplifying an amplitude and frequency varying input signal to high power levels. Each of the switches has two states. In the first state, the associated incremental voltage source is interconnected in series with the other selected voltage sources across the output, whereas in the other state, the associated incremental voltage source is disconnected from the output.

In the implementation of such series switching power supply-modulator circuits for amplitude modulation radio transmitters, a recurring problem is that when the switching algorithm requires that one of the switching modules near the grounded end of the series stack turn on or off, this produces a step function change which is added to the voltage to ground of all of the modules above it. This in turn produces large transient capacitive currents, since the secondary windings of the power transformers in these circuits unavoidably have significant capacitance to ground (the electrostatic shield between the primary and secondaries).

U.S. Pat. No. 4,745,368 issued to Lodahl utilizes current limiters to limit the high peak current of the semiconductor switches caused by the commutation characteristics of the cascade-connected semiconductor diodes. Lodahl further utilizes linearization devices compensating for non-linearities in the transmission characteristic of an amplifier. Although Lodahl deals with limiting transient currents and improving the linearity of the switching amplifier, it does not provide a means for equalizing the capacitive currents for each module. Thus, the capacitive currents are still large for a module near the ground end of the series stack of switches and much smaller for a module near the top of the series stack of switches. The variation in capacitive current is also present in other such switchable power supply-modulated radio transmitters as illustrated by the disclosures of Furrer (U.S. Pat. No. 4,560,944) and Beeken et al (U.S. Pat. No. 4,730,167). This variation in the capacitive current tends to produce variation in switching times and, as a result, distortion of the output audio waveform.

Also, the switching sequence of the modules in Furrer and Beeken et al use a simple inchworm sequence in which modules are turned on in the order of their position in the stack, beginning at the bottom. Since adjacent modules are being turned on, transient voltages from several successively switched modules are produced and added due to the close electrical and physical proximity between the successively switched modules. This causes unequal loading.

SUMMARY OF THE INVENTION

The circuitry of the present invention reduces these voltage transients and resulting capacitive currents by apportioning the input inductance of the low pass filter equally among all of the modules. The step function voltage transient due to a module switching on or off is then divided among the inductors of a few adjacent modules (which with the capacitance of the transformer windings form a distributed low pass filter), with a much more gradual voltage change applied to the remainder of the modules and the load. This substantially reduces the capacitive currents and makes these currents nearly independent of the position of the module being switched.

To further reduce capacitive current problems, the switching sequence of the modules should not be a simple "inchworm" sequence as previously discussed. Rather it is preferable that modules switched in sequence be separated by a substantial distance in the stack; for example, by separating successively switched modules by at least one quarter of the total number of modules. This avoids the tendency to add the transient voltages from several successively switched modules on the same group of adjacent inductors. To produce such a sequence, programmable logic circuitry is utilized with digital counters and transposed address decoding, that turns on modules in a predetermined sequence and also turns off modules in the same sequence. This turns off the switching module which has been on the longest without needing any time measurement circuits.

Hence, it is an object of this invention to employ a series switching power supply-modulator circuit for an amplitude modulated radio transmitter that reduces voltage and current transients resulting from switching a module near the grounded end of the stack.

It is another object of this invention to reproduce an audio waveform with low distortion on an amplitude modulated radio transmitter.

It is a further object of this invention to employ a series switching power supply-modulator circuit for an amplitude modulated radio transmitter that reduces the capacitive current problems caused by switching adjacent modules.

Other objects will become apparent upon a reading of the following description.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 3 is a schematic block diagram of the stack control of the present invention.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

The preferred embodiment herein described is not intended to be exhaustive or to limit the invention to the precise form disclosed. It is chosen and described to explain the principles of the invention and its application and use to enable others skilled in the art to understand its teaching.

The invention is described herein with respect to an amplifier used in the RF Modulation state of a conventional AM transmitter, although the invention may be used in a variety of transmitters.

Figure 1:
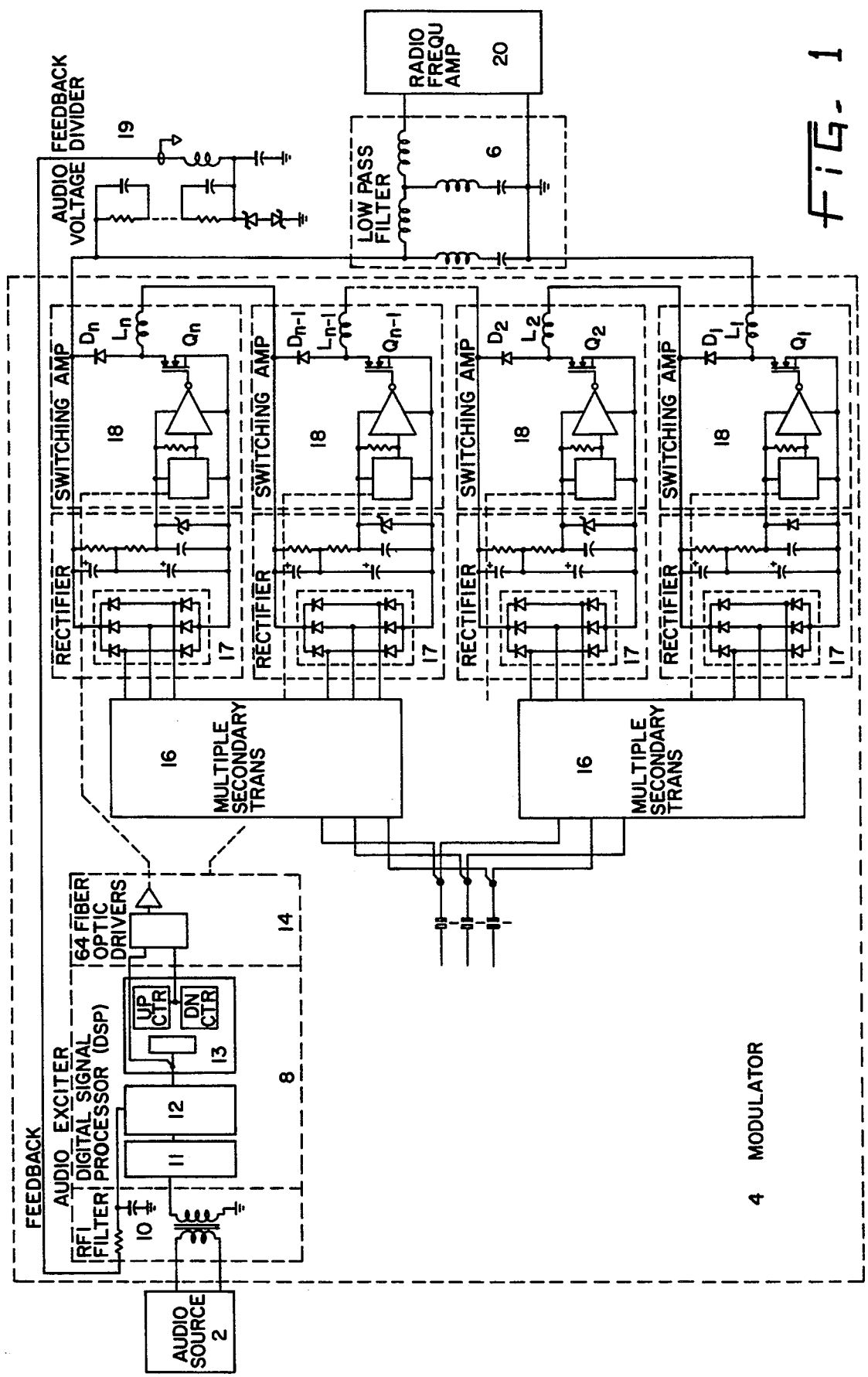
FIG. 1 is a block diagram of the amplifier circuit in accordance with the teachings of the present invention.

Referring now to FIG. 1, the transmitter system includes audio source 2 which generates the amplitude and frequency varying audio signal which is to be transmitted. This audio signal VA is supplied to amplifier 4 (Modulator) which amplifies the signal VA to the desired power level and provides the resulting varying amplitude signal at its output to low pass filter assembly 6. Low pass filter 6 serves to limit the output signal bandwidth and suppress the high frequency noise produced in the switching amplifier. The resulting signal is then supplied to an RF power amplifier.

The amplifier circuit includes audio exciter 8 as shown in detail in FIG. 1. The incoming audio passes through RFI filter 10 to analog-to-digital (A/D) converter 11 where the analog signal is converted into a digital word comprised of a plurality of individual bits. These bits together indicate the instantaneous level of the input audio signal to within an incremental limit, and change with time to indicate the changing level of the audio signal. Digital Signal Processor (DSP) 12 adjusts the amplitude of the digital representation of the audio signal as required for proper modulation of the transmitter, low-pass filters it to eliminate spurious frequencies that may be present in the input, and compares it with the feedback from voltage divider 19 at the output of the modulator. It adds the change in the input signal to the feedback error and derives from it a digital representation of the required increment or decrement in the number of active modules.

The output of digital signal processor 12 is processed in Switching Control logic 13 to provide control signals to fiber optic drivers 14 which send optical signals to switching amplifiers 18. Each switching amplifier is fed by a voltage source comprised by one of the secondary windings of transformer 16 and rectifier and filter 17. The output voltages of switching amplifiers 18 add in series to produce the varying output through low pass filter 6 to radio frequency amplifier 10 (transmitter or load). The output of the active switching amplifiers is coupled to the load through the bypass diodes Dn of the inactive amplifiers.

The audio exciter controls the switching amplifiers using a variation of the well known first-in first-out (FIFO) buffer or stack technique frequently used, which is shown schematically in FIG. 3. In the case of a one bit wide (serial) buffer, each incoming data bit is stored at a memory location pointed to by "On" address counter 27. After the bit is stored, "On" counter 27 is incremented to point to the next available memory location. Since this is a modulo N counter, incrementing it beyond the last memory location automatically returns it to the beginning of the block of memory, effectively converting the linear buffer or stack to a circular buffer or stack Similarly, "Off" address counter 28 allows reading of the bits in the order in which they were written, regardless of the number of bits in the buffer, (First-in, First-out) and may also erase the contents of each bit after reading.

From this generally known technique, it is a simple step to a switching control in which each buffer bit has a parallel output, "On" counter 27 always writes logic ones into the buffer bits, and "Off" counter 28 erases them. The output of each buffer bit controls a switching amplifier, via fiber-optic data link 14 for ground isolation, so that each active bit produces an equal increment in the output voltage of the modulator.

The transposition of the address bits going to the decoder produces the required non-adjacent switching sequence in which each module is removed as far as practicable from the recently turned-on modules so that transient voltages are distributed uniformly as shown in Table 1. Although FIG. 3 shows a Transposition box, no additional circuitry is needed as the transposition is effected by the connection of wires according to Table 1.

TABLE 1

| Counter (decimal) | Binary | Transpose | Driver Address | Absolute Difference |
|---|---|---|---|---|
| 0 | 000000 | 000000 | 0 | 63 |
| 1 | 000001 | 100000 | 32 | 32 |
| 2 | 000010 | 010000 | 16 | 16 |
| 3 | 000011 | 110000 | 48 | 32 |
| 4 | 000100 | 001000 | 8 | 40 |
| 5 | 000101 | 101000 | 40 | 32 |
| 6 | 000110 | 011000 | 24 | 16 |
| 7 | 000111 | 111000 | 56 | 32 |
| 8 | 001000 | 000100 | 4 | 52 |
| 9 | 001001 | 100100 | 36 | 32 |
| 10 | 001010 | 010100 | 20 | 16 |
| 11 | 001011 | 110100 | 52 | 32 |
| 12 | 001100 | 001100 | 12 | 40 |
| 13 | 001101 | 101100 | 44 | 32 |
| . | . | . | . | . |
| . | . | . | . | . |
| . | . | . | . | . |
| 62 | 111110 | 011111 | 31 | 16 |
| 63 | 111111 | 111111 | 63 | 32 |
| 0 | 000000 | 000000 | 0 | 63 |

It should be noted that this stack circuit automatically gives first-on first-off operation of the switching amplifiers without requiring any circuits to monitor the "on" time of the amplifiers as needed in Furrer (4,560,944). It also automatically produces substantially equal thermal loading of all the rectifier-switch modules without any added circuits.

Figure 2:
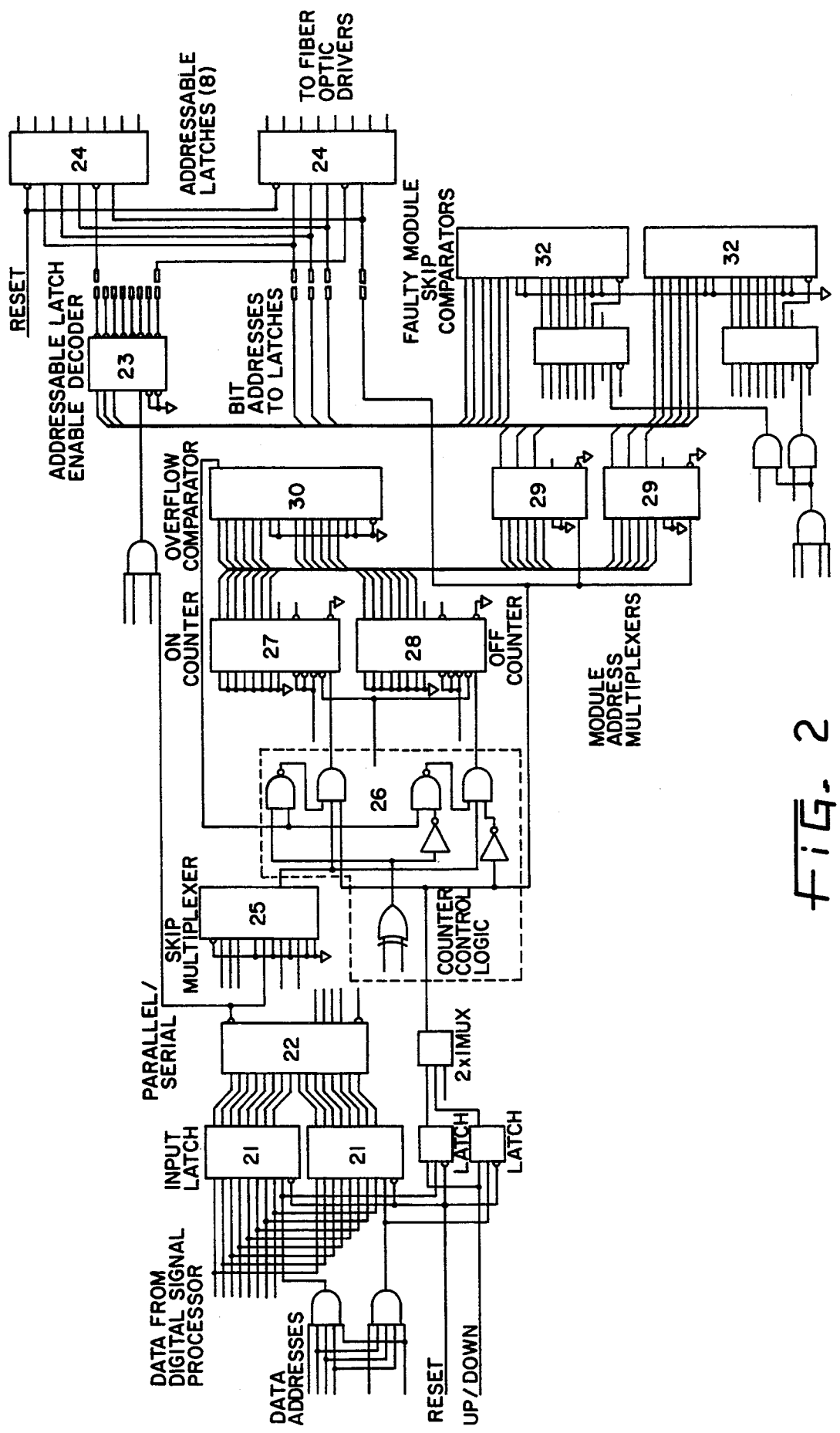
FIG. 2 is a block diagram of the logic circuitry of the Digital Signal Processor.

FIG. 2 shows the logic of a typical implementation of this type of control. The bits of a word from the Digital Signal Processor define the instants (typically in increments of approximately 1 microsecond) at which the audio signal requires that the number of active switching amplifiers be incremented or decremented, and the up/down signal indicates whether the change should be an increment or decrement. The word is stored in input latch 21 and the bits are sent sequentially to counter control logic and addressable latches 24 by parallel/-serial converter 22. Multiplexer 29 selects the output of the "on" or "off" address counter, depending on the value of the up/down signal AU/D, and sends three address bits to address decoder 23 and three to the selection inputs of 8 bit addressable latches 24. Decoder 23 routes the clock pulse to the addressed memory bit "latch", and the up/down signal defines the new state of the bit. If the selected bit was set "on" "on" counter 27 is then incremented by counter control logic 26 to point to the next memory bit to be turned on If the selected bit was set "off" "off" counter 28 is similarly incremented.

Each time the amplifier is turned on, digital signal processor 12 tests all of the switching amplifiers. If an amplifier fails to turn on or turn off, its address is placed in the latch of one of faulty module skip comparators 32. When the address in a counter is incremented to be equal to the latched address, comparator 32 output becomes a logic 1, and skip multiplexer 25 produces an additional pulse to advance the counter past the address of the defective module prior to the next "on" or "off" pulse. The sequencing of all these pulses is determined by signals from the continuously operating timing generator.

When all of the switching amplifiers are turned off, the addresses in the "on" and "off" counters are equal. If Digital Signal Processor 12 should then erroneously request that an additional amplifier be turned off, overflow comparator 30 detects the error and via control logic 26 inhibits any further advancing of "off" counter 28. Similarly if all of the amplifiers are turned on, overflow comparator 30 inhibits the advancing of "on" counter 27. Without this protection, digital signal processor 12 could possibly lose control of the switching amplifiers by attempting to turn off modules that were already off, or to turn on amplifiers that were already on.

A diode cascade is shown in FIG. 1 and consists of a series connection of diodes D1 to DN, with one end of the series of diodes being connected to the anode of the capacitors from low pass filter assembly 6. The other end forms the output terminal of the switching amplifier that is connected by low pass filter assembly 6 to RF amplifier 20.

In addition, the inductors L1 to LN are inserted between each diode associated with a switching module, and in essence apportion the input inductance of low pass filter 6 equally among all modules. The step function voltage transient, which occurs due to a module near the grounded end of the stack that is switching, is then divided among the inductors of a few adjacent modules with a much more gradual voltage change applied to the remainder of the modules and the load. This substantially reduces the capacitance currents resulting from the transient voltage and makes these currents nearly independent of the position of the module being switched.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A transmitter comprising:
   a plurality of switchable voltage sources, each being switchable to supply an output voltage;
   a plurality of diodes, each of said diodes being connected across a corresponding one of said voltage sources, each said diode being connected in series to form a series connection having output terminals;
   a plurality of inductance means for apportioning the input inductance of said series connection equally among said voltage sources, said plurality of inductance means being operably coupled between adjacent ones of said diodes within said series connection;
   control means for receiving a modulated voltage signal and for switching said voltage sources according to the temporary value of the amplitude of the modulated voltage signal; and means for producing an RF signal based on the voltage apparent at said output terminals.

2. The transmitter of claim 1 wherein said control means and said voltage sources are connected by optical coupling means.

3. The transmitter of claim 1 wherein each said voltage source includes a transformer with associated rectifying and switching means.

4. The transmitter of claim 1 further comprising feedback means for influencing said control means, said feedback means coupling said control means and said series connection.

5. The transmitter of claim 1 further comprising low pass filter means connecting said series connection of said voltage sources and said RF producing means.

6. A transmitter comprising:
   means for receiving an input signal;
   a plurality of switchable voltage sources disposed in a series arrangement;
   means for producing an RF signal, said RF producing means being connected to said series arrangement of voltage sources; and
   control means for switching said voltage sources according to the input signal, said control means including buffer means for sequencing the switching of said voltage sources according to a predetermined switching sequence responsive to changes in the input signal so that pairs of said voltage sources which are adjacent in said predetermined switching sequence are substantially separately physically disposed in said series arrangement of said voltage sources.

7. The transmitter of claim 6 wherein said control means and said voltage sources are connected by optical coupling means.

8. The transmitter of claim 6 wherein each said voltage source includes a transformer with associated rectifying and switching means.

9. The transmitter of claim 6 further comprising feedback means for influencing said control means, said feedback means coupling said control means and said series arrangement of said voltage sources.

10. The transmitter of claim 6 further comprising low pass filter means for limiting said RF signal, said low pass filter means connecting said series arrangement of said voltage sources and said RF producing means.

11. A transmitter comprising:
    means for receiving an input signal;
    a plurality of switchable voltage sources disposed in a series arrangement;
    means for producing an RF signal, said RF producing means being connected to said series arrangement of voltage sources; and
    control means for switching said voltage sources according to the input signal, said control means including buffer means for sequencing the switching of said voltage sources according to a predetermined switching sequence responsive to changes in the input signal, said buffer means including a plurality of locations, each said location associated with one of said voltage sources, and said buffer means including an on counter and an off counter referencing the next one of said locations to be switched on and the next one of said locations to be switched off, respectively.

12. The transmitter of claim 11 wherein said buffer means includes means for preventing each one of said counters from passing the other said counter.

13. The transmitter of claim 6 wherein said control means includes means for identifying inoperative ones of said voltage sources and means for skipping said inoperative ones of said voltage sources in said predetermined switching sequence.

14. The transmitter of claim 11 wherein said control means and said voltage sources are connected by optical coupling means.

15. The transmitter of claim 11 wherein each said voltage source includes a transformer with associated rectifying and switching means.

16. The transmitter of claim 11 further comprising feedback means for influencing said control means, said feedback means coupling said control means and said series arrangement of said voltage sources.

17. The transmitter of claim 11 further comprising low pass filter means for limiting said RF signal, said low pass filter means connecting said series arrangement of said voltage sources and said RF producing means.

18. The transmitter of claim 11 wherein said control means includes means for identifying inoperative ones of said voltage sources and means for skipping said inoperative ones of said voltage sources in said predetermined switching sequence.

19. The transmitter of claim 11 wherein said buffer means operates on a first-in first-out basis.

20. The transmitter of claim 11 wherein said on counter and said off counter are modulo counters.

* * * * *